(12) United States Patent
Nakano

(10) Patent No.: US 10,539,280 B2
(45) Date of Patent: Jan. 21, 2020

(54) LIGHT-SOURCE DEVICE

(71) Applicant: MITSUBISHI ELECTRIC CORPORATION, Tokyo (JP)

(72) Inventor: Seiji Nakano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 290 days.

(21) Appl. No.: 15/519,768

(22) PCT Filed: Jan. 26, 2016

(86) PCT No.: PCT/JP2016/052094
§ 371 (c)(1),
(2) Date: Apr. 17, 2017

(87) PCT Pub. No.: WO2016/121725
PCT Pub. Date: Aug. 4, 2016

(65) Prior Publication Data
US 2017/0292662 A1     Oct. 12, 2017

(30) Foreign Application Priority Data

Jan. 29, 2015    (JP) ................................. 2015-015176

(51) Int. Cl.
*F21S 8/00*         (2006.01)
*G02B 27/30*        (2006.01)
*H01S 3/00*         (2006.01)

(52) U.S. Cl.
CPC ................ *F21S 8/03* (2013.01); *G02B 27/30* (2013.01); *H01S 3/00* (2013.01)

(58) Field of Classification Search
CPC .......................... H01S 5/02212; H01S 5/02288
See application file for complete search history.

(56) References Cited

U.S. PATENT DOCUMENTS

| 5,296,724 A * | 3/1994 | Ogata .................. G02B 6/4204 257/680 |
| 5,500,768 A | 3/1996 | Doggett et al. |
| 5,997,153 A * | 12/1999 | Naoe .................... G02B 6/4204 362/259 |
| 2003/0063391 A1* | 4/2003 | Wang ....................... B41J 2/451 359/626 |

(Continued)

FOREIGN PATENT DOCUMENTS

| CN | 1375897 A | 10/2002 |
| CN | 1474209 A | 2/2004 |

(Continued)

OTHER PUBLICATIONS

Office Action issued in corresponding Canadian Patent Application No. 2,964,209 dated Sep. 17, 2018.

(Continued)

*Primary Examiner* — Anh T Mai
*Assistant Examiner* — Zachary J Snyder
(74) *Attorney, Agent, or Firm* — Birch, Stewart, Kolasch & Birch, LLP

(57) ABSTRACT

It is an object of the present invention to provide a small and simply-structured light-source device. A light-source device according to the present invention includes a laser light source section, a stem on which the laser light source section is mounted, a cap with an opening, the cap being bonded to the stem in such a manner that the cap covers the laser light source section, a lens holder joined to an outer surface of the cap in such a manner that the lens holder extends over the opening, and a collimating lens supported by the lens holder, the collimating lens collimating a light ray emitted from the laser light source section and then passing through the opening.

9 Claims, 7 Drawing Sheets

(56) References Cited

U.S. PATENT DOCUMENTS

| | | | |
|---|---|---|---|
| 2004/0005111 A1 | 1/2004 | Ishikawa et al. | |
| 2004/0240087 A1* | 12/2004 | Matsushima | G02B 6/4204 359/820 |
| 2006/0039441 A1* | 2/2006 | Aoshima | H01S 3/09415 372/92 |
| 2008/0116473 A1* | 5/2008 | Sugiyama | H01L 33/483 257/98 |
| 2011/0051759 A1 | 3/2011 | Telford et al. | |
| 2014/0003062 A1* | 1/2014 | Yoshimura | F21V 5/00 362/311.12 |
| 2014/0152963 A1 | 6/2014 | Lin et al. | |

FOREIGN PATENT DOCUMENTS

| | | |
|---|---|---|
| CN | 2615923 Y | 5/2004 |
| CN | 102640368 A | 8/2012 |
| CN | 103094837 A | 5/2013 |
| CN | 103412406 A | 11/2013 |
| CN | 103545701 A | 1/2014 |
| CN | 103852850 A | 6/2014 |
| JP | 3-44992 A | 2/1991 |
| JP | 5-235484 A | 9/1993 |
| JP | 2007-139877 A | 6/2007 |
| JP | 2010-103323 A | 5/2010 |
| JP | 2012-128999 A | 7/2012 |
| WO | WO 2010/047147 A1 | 4/2010 |

OTHER PUBLICATIONS

Office Action issued for the corresponding Canadian Patent Application No. 2,964,209, dated Feb. 19, 2018.

Extended European Search Report issued in Euroepan Application No. 16743328.3 dated Aug. 3, 2018.

* cited by examiner

F I G. 7
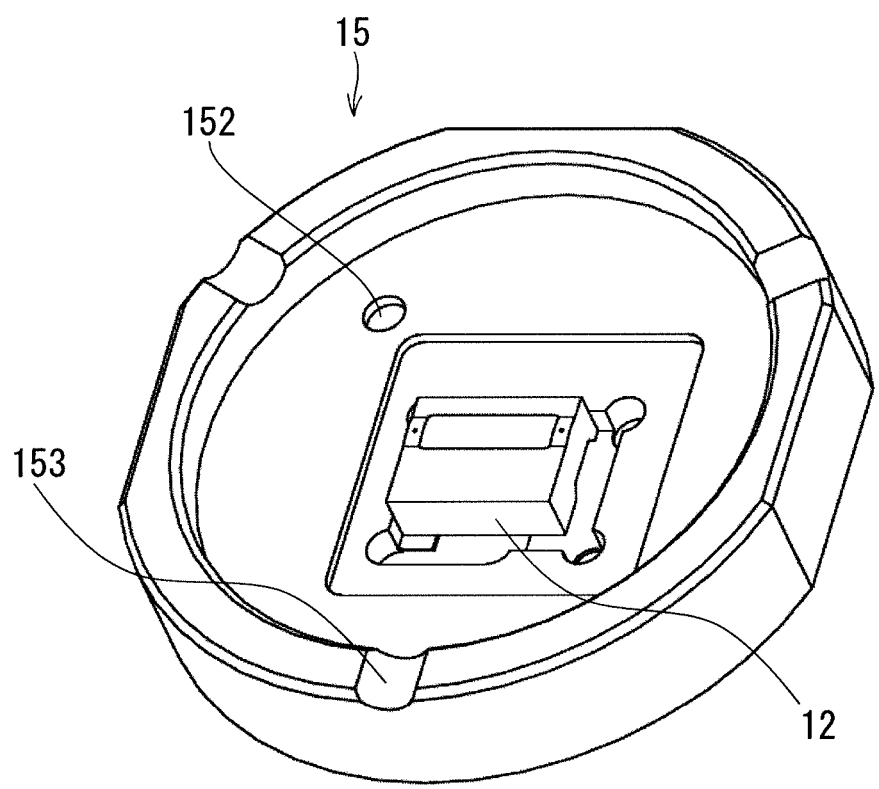

F I G. 8
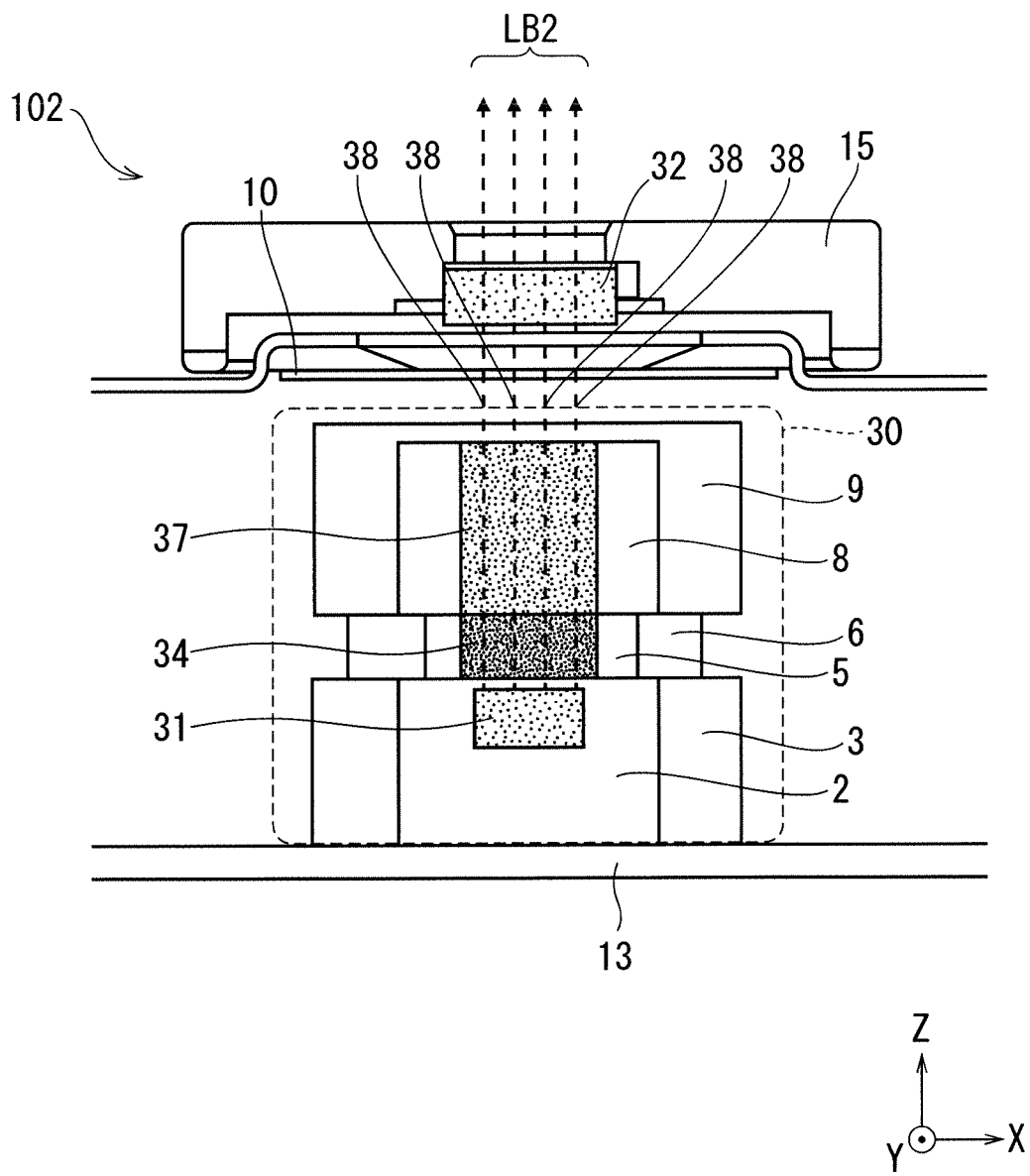

LIGHT-SOURCE DEVICE

TECHNICAL FIELD

The present invention relates to a light-source device that includes a laser light source and a collimating lens.

BACKGROUND ART

Halogen lamps or metal halide lamps are conventionally used for light sources included in display apparatuses such as projectors. Laser light sources with long life, low power-consumption, high luminance, and high color-purity have been growingly used for the display apparatuses.

One way to use such a laser light source for the projector is condensing bundles of light emitted from laser light sources (units) for respective colors, i.e., R, G, and B (primary colors), then radiating the bundles of light as condensed to a plurality of optical fibers, and then transmitting, through the optical fibers, laser light rays to an optical component of an illumination optical system included in the projector so as to project a visual image.

Patent Document 1 discloses a light-source device with a semiconductor-light-emitting-chip-integrated laser light source and a collimating lens connected together by a holder. This light-source device enables the adjustment of optical axes of the laser light source and collimating lens in the following manner: inserting a stem on which the laser light source is mounted into the inner periphery at the rear end of the holder, and then moving a laser light source unit within a clearance as generated.

PRIOR ART DOCUMENT

Patent Document

Patent Document 1: Japanese Patent Application Laid-Open No. 5-235484

SUMMARY OF INVENTION

Problem to be Solved by the Invention

In the light-source device in Patent Document 1, the holder is adhesively fixed to the side surfaces of the stem on which the laser light source is mounted. Thus, the holder covers the laser light source. Unfortunately, such a structure results in a large light-source device and thus an increase in cost.

The present invention has been made to solve the aforementioned problem. It is an object of the present invention to provide a small and simply-structured light-source device.

Means for Solving the Problem

A light-source device according to the present invention includes a laser light source section, a stem on which the laser light source section is mounted, a cap with an opening, the cap being joined to the stem in such a manner that the cap covers the laser light source section, a lens holder joined to an outer surface of the cap in such a manner that the lens holder extends over the opening, and a collimating lens supported by the lens holder, the collimating lens collimating a light ray emitted from the laser light source section and then passing through the opening the collimating lens includes an incident surface receiving the light ray from the laser light source section, an outgoing surface from which the light ray received by the incident surface exits, a first protrusion protruding from the outgoing surface and bonded to the lens holder, and a second protrusion protruding in the same direction as the first protrusion, from a position opposite to the first protrusion with respect to the outgoing surface, the second protrusion having a surface on the same plane as that of the first protrusion.

The light-source device according to the present invention includes the laser light source section, the stem on which the laser light source section is mounted, the cap with the opening, the cap being joined to the stem in such a manner that the cap covers the laser light source section, the lens holder joined to the outer surface of the cap in such a manner that the lens holder extends over the opening, and the collimating lens supported by the lens holder, the collimating lens collimating the light ray emitted from the laser light source section and then passing through the opening, the collimating lens includes an incident surface receiving the light ray from the laser light source section, an outgoing surface from which the light ray received by the incident surface exits, a first protrusion protruding from the outgoing surface and bonded to the lens holder, and a second protrusion protruding in the same direction as the first protrusion, from a position opposite to the first protrusion with respect to the outgoing surface, the second protrusion having a surface on the same plane as that of the first protrusion. Such a configuration enables a simple structure and a small device.

These and other objects, features, aspects and advantages of the present invention will become more apparent from the following detailed description of the present invention when taken in conjunction with the accompanying drawings.

BRIEF DESCRIPTION OF DRAWINGS

FIG. 7 is a perspective view of the lens holder according to the first embodiment with the collimating lens bonded thereto.

FIG. 8 is a cross-sectional view of a light-source device according to a second embodiment.

DESCRIPTION OF EMBODIMENTS

A. First Embodiment

Figure 1:
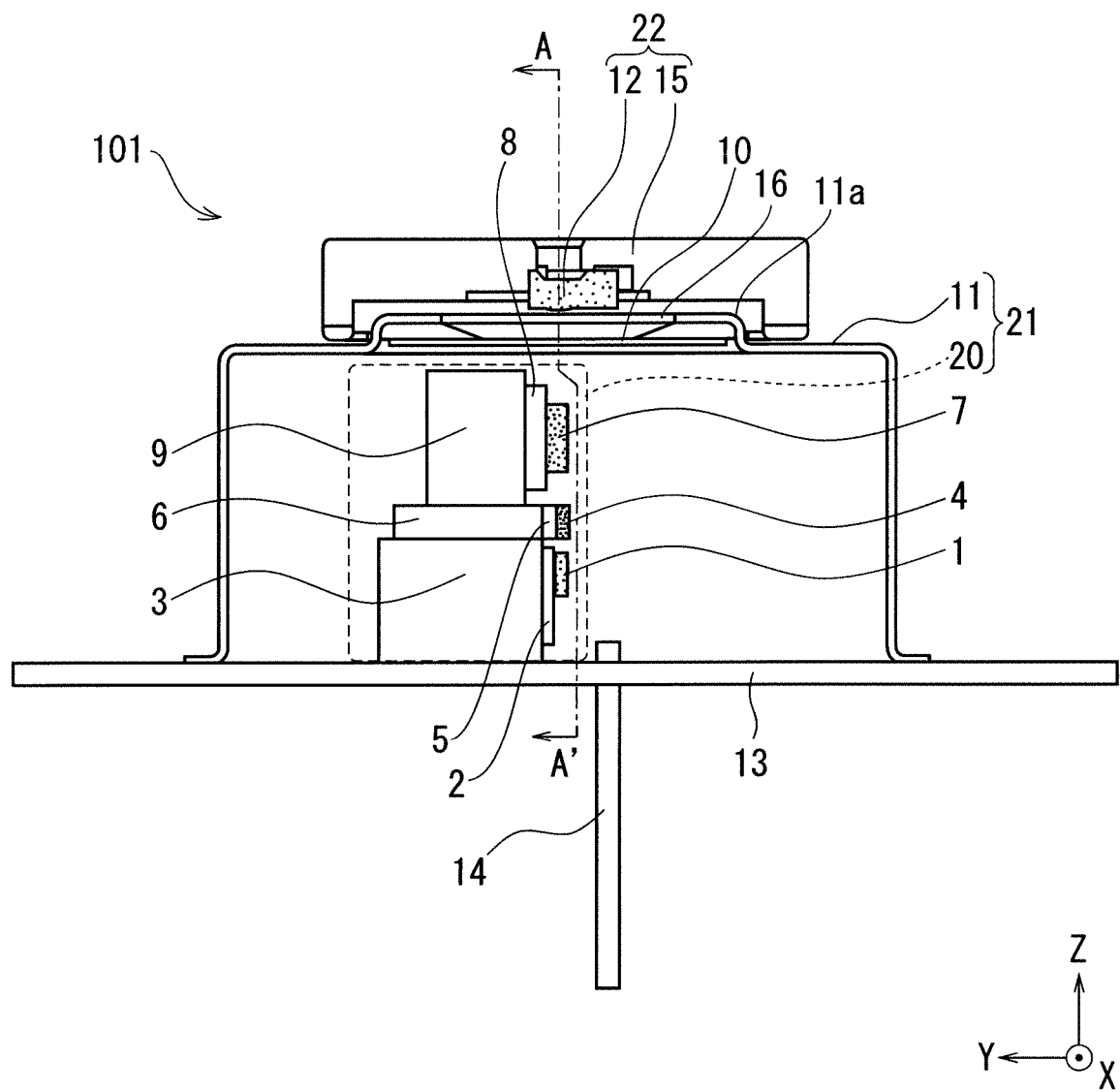
FIG. 1 is a cross-sectional view of a light-source device according to a first embodiment.
Figure 2:
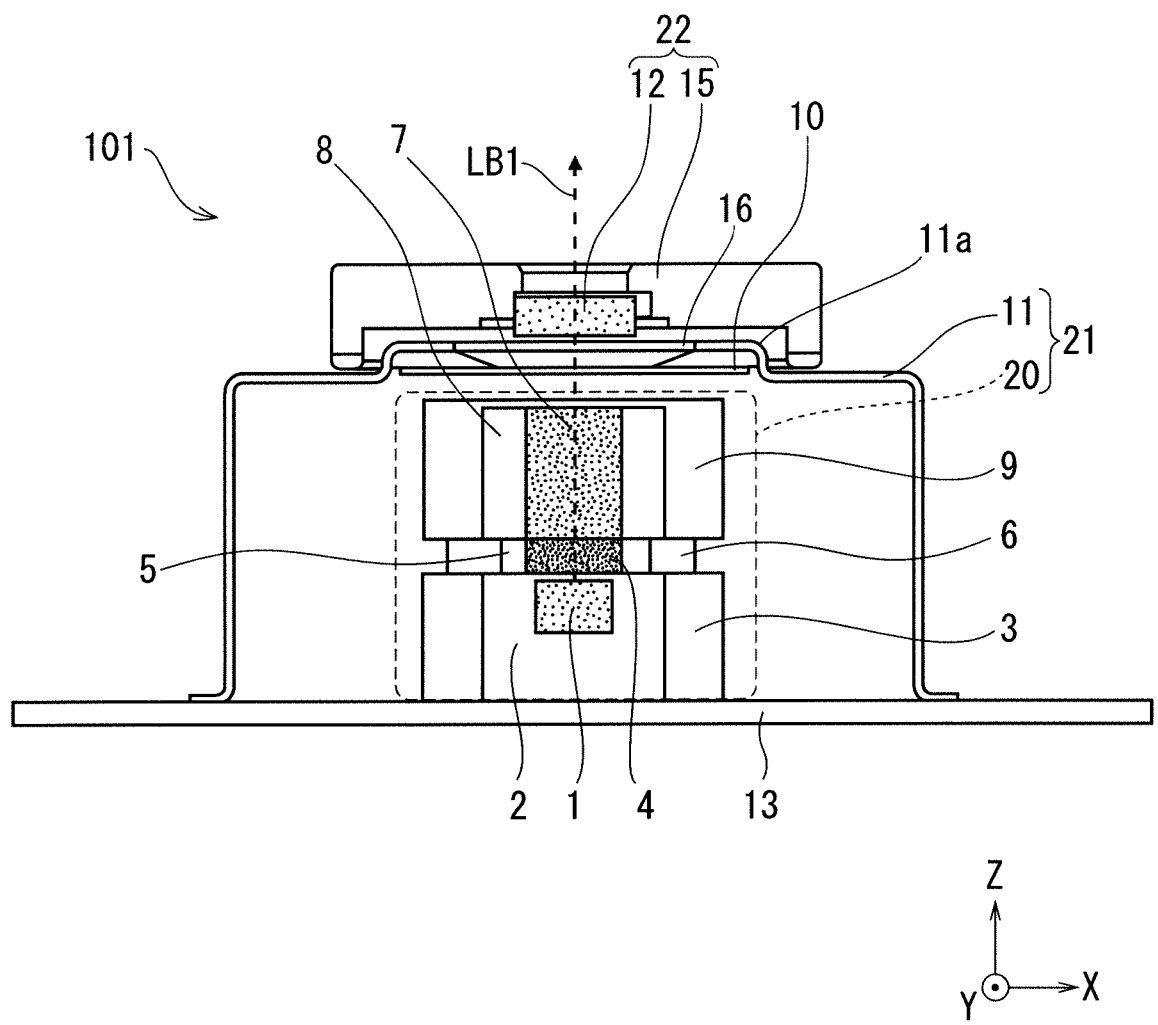
FIG. 2 is a cross-sectional view of the light-source device according to the first embodiment.

FIG. 1 schematically illustrates a light-source device 101 according to a first embodiment of the present invention. In FIG. 1, let the rear direction of the sheet be the positive direction of an X-axis; the left direction of the sheet, the positive direction of a Y-axis; and the upper direction of the sheet, the positive direction of a Z-axis. FIG. 2 schematically illustrates the A-A' cross-section in FIG. 1. The following describes a configuration of the light-source device 101 with reference to FIG. 1. In FIG. 2, the same symbols as those in FIG. 1 denote respective like components. Thus, the details of FIG. 2 are not provided herein.

The light-source device 101 includes a stem 13, a laser light source unit 21 mounted on the stem 13, and a lens unit 22 bonded to the laser light source unit 21. The laser light source unit 21 includes the following: a light source section 20 that includes a light source element 1, a wavelength-conversion element 4, and a wavelength-conversion element 7; a cap 11 that contains the light source section 20, and is disposed on the stem 13; a transmission portion 10 disposed at a protrusion 11a of the cap 11; and a pin 14 for external connection that extends through the stem 13, and supplies electric power to the light source section 20. A detailed configuration of the light source section 20 will be described later on.

The stem 13 is a plate and contains, for instance, a metal material whose surface is plated with Au. The stem 13 is used for fixing the light source section 20 and dissipating heat generated in the light source section 20 to the outside of the light-source device 101.

The cap 11 is a hollow, substantial cylinder that covers the light source section 20. The cap 11 is closed at one end and open at the other end. The cap 11 has, at the closed end, a surface whose center part protrudes outward from the rest of the surface to form the protrusion 11a. The protrusion 11a has an opening 16 at the center part of its surface. The transmission portion 10 is disposed inside the protrusion 11a so as to close the opening 16. The transmission portion 10 can be made of, for instance, quartz glass.

The cap 11 is brazed (joined), at the open end, to the stem 13 by, for instance, projection wielding. Thus, the cap 11 is sealed by the transmission portion 10 and the stem 13. The cap 11 and the light source section 20 are joined to the same surface of the stem 13.

The lens unit 22 includes the following: a lens holder 15 adhesively fixed to the outer surface, i.e., the upper surface of the cap 11 and covering the protrusion 11a; and a collimating lens 12 held by the lens holder 15. As illustrated in FIG. 2, the light source element 1, the wavelength-conversion elements 4 and 7, the transmission portion 10, and the collimating lens 12 are aligned in a z-direction, so that a laser light ray LB1 emitted from the light source section 20 passes through the transmission portion 10 and the collimating lens 12 and then exits the outside of the light-source device 101.

Figure 3:
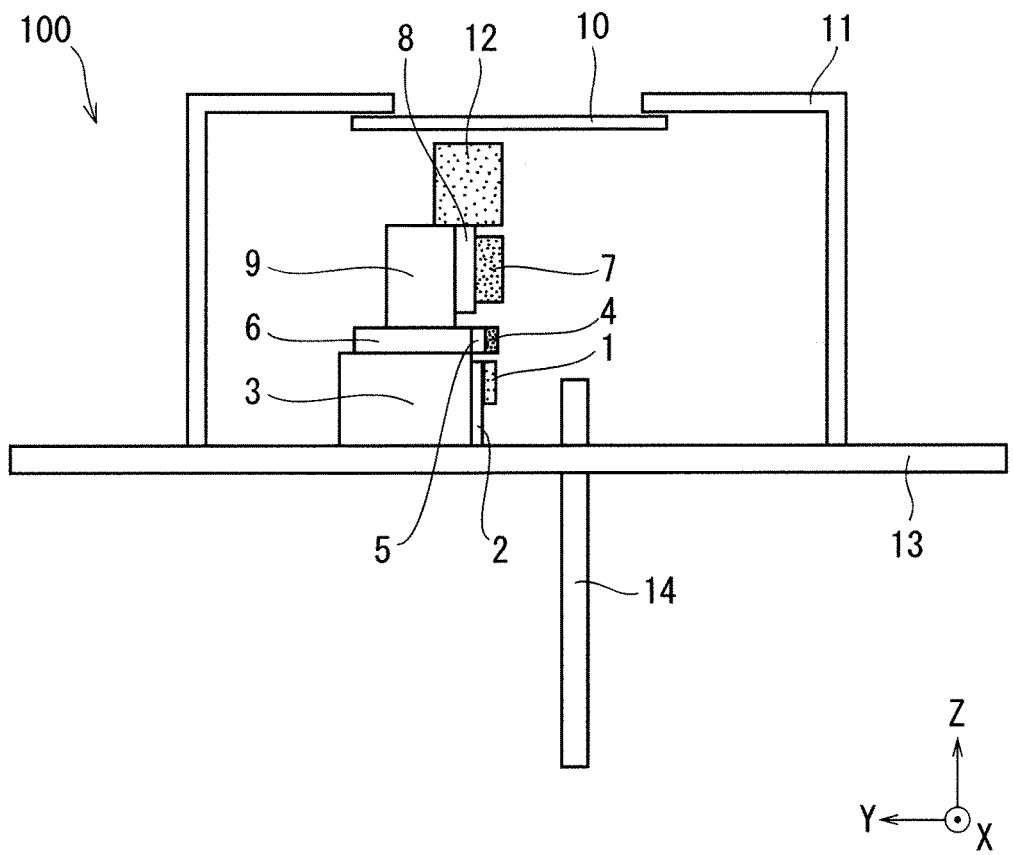
FIG. 3 is a cross-sectional view of a light-source device according to a comparative example.

The following describes an advantage of the light-source device 101 with reference to a comparative example. FIG. 3 is a cross-sectional view of a light-source device 100 according to the comparative example. In FIG. 3, the same symbols as those in FIG. 1 denote like components. Thus, the like components are not described herein. In the light-source device 100, the collimating lens 12 is not held by the lens holder 15, but is directly fixed to the upper surface of a third block 9.

As illustrated in FIG. 3, when the collimating lens 12 is disposed inside the cap 11, the cap 11 of the light-source device 100 is higher than the cap 11 of the light-source device 101, in which the collimating lens 12 is disposed outside the cap 11. Thus, the light-source device 101 is configured such that the collimating lens 12 is disposed outside the cap 11. Such a configuration enables the cap 11 to be low when compared with the configuration in which the collimating lens 12 is disposed inside the cap 11.

The lower cap 11 reduces the cost of manufacture of the cap 11 and also enables the light-source device 101 to be small. The small light-source device 101 achieves a small heat-dissipation mechanism disposed outside the light-source device 101. This enables an apparatus that includes the light-source device 101 to be small in its entirety.

In the comparative example, the light-source device 100 is configured such that the collimating lens 12 is fixed on the third block 9, and thus the light-source device 100 receives a great moment force caused by vibrations of the light source section 20. In contrast, the light-source device 101, in which the collimating lens 12 is disposed outside the cap 11, does not receive such a great moment force. This reduces risks including the detachment of the collimating lens 12.

The light-source device 101 is also configured such that the lens holder 15 is adhesively fixed to the upper surface of the cap 11, above the transmission portion 10. Such a configuration achieves a simple structure and a small device when compared with, for instance, a configuration in which the lens holder 15 is adhesively fixed to the side surface of the stem 13.

The manufacture process of the light-source device 101 requires a step of sealing the inside of the cap 11 and a step of adjusting (aligning) an optical axis of the light source section 20 and an optical axis of the collimating lens 12. The step of sealing the inside of the cap 11 would need to be simultaneous with the step of aligning the light source section 20 and the collimating lens 12 in any structure in which the cap 11 and the collimating lens 12 are integrated or in which the collimating lens 12 is disposed inside the cap 11 like the light-source device 100 illustrated in FIG. 3. This makes working steps complicated. Meanwhile, the light-source device 101 is configured such that the collimating lens 12 is disposed outside the cap 11. Consequently, in such a configuration, the step of sealing the inside of the cap 11, and the step of aligning the light source section 20 and the collimating lens 12 are individually performed. This reduces risks, such as a shift in optical axis of emitted light and a variation in position of a focal point, to thus increase yields.

As described, the light-source device 101 according to the first embodiment includes the light source section 20 (laser light source section), the stem 13 on which the laser light source section is mounted, the cap 11 with the opening 16, the cap 11 being joined to the stem 13 in such a manner that the cap 11 covers the laser light source section, the lens holder 15 joined to the outer surface of the cap 11 in such a manner that the lens holder 15 extends over the opening 16, and the collimating lens 12 supported by the lens holder 15 and collimating a light ray emitted from the laser light source section and passing through the opening 16. The collimating lens 12 is disposed outside the cap 11. Such positioning achieves a simple structure and a small device. Such positioning also allows the step of sealing the inside of the cap 11 and the step of aligning the light source section 20 and collimating lens 12 to be performed individually. This reduces the risks, such as the shift in optical axis of the emitted light and the variation in position of the focal point, to thus increase the yields. In addition, the collimating lens 12 is supported by the holder 15. Such a configuration reduces damage to the collimating lens 12 due to external factors.

The following details the light source section 20 with reference to FIG. 1. As illustrated in FIG. 1, the light source section 20 includes the following: the light source element 1 (excitation light source) that emits a fundamental-wave laser light ray; the first wavelength-conversion element 4 (solid laser element) that oscillates the fundamental-wave laser light ray as emitted from the light source element 1; the second wavelength-conversion element 7 that converts the wavelength of the laser light ray as oscillated by the first wavelength-conversion element 4; a first submount 2, second submount 5, and third submount 8 on which the light source element 1, the first wavelength-conversion element 4, and the second wavelength-conversion element 7 are respectively mounted; and a first block 3, second block 6, third block 9 on which the first submount, the second submount 5 and the third submount 8 are respectively mounted.

The first block 3 is mounted on the stem 13. The second block 6 is connected to a surface of the first block 3, opposite to a surface on which the stem 13 is disposed. The third block 9 is connected to a surface of the second block 6, opposite to the surface to which the first block 3 is connected. Although not shown, the pin 14 is connected to the light source element 1 in such a manner that electric power is suppliable to the light source element 1. Examples of an adhesive include solder, a conductive adhesive, and a nonconductive for the following connections: the connection between the first block 3 and the stem 13; the connection between the first block 3 and the second block 6; the connection between the second block 6 and the third block 9; the connection between the first submount 2 and the first block 3; the connection between the second submount 5 and the second block 6; the connection between the third submount 8 and the third block 9; the connection between the first submount 2 and the light source element 1; the connection between the second submount 5 and the first wavelength-conversion element 4; and the connection between the third submount 8 and the second wavelength-conversion element 7.

The light source element 1, the first wavelength-conversion element 4, and the second wavelength-conversion element 7 are aligned in that order, in such a manner that the light source element 1 is adjacent to the stem 13. The light source element 1, the first wavelength-conversion element 4, and the second wavelength-conversion element 7 generate laser light rays. In addition, the laser light ray emitted from the second wavelength-conversion element 7 passes through the transmission portion 10 and then enters the collimating lens 12.

The light source element 1 can be made of, for instance, GaAs. An optical waveguide of the first wavelength-conversion element 4 can be made of, for instance, Nd:YVO4 or Nd:YAG. The second wavelength-conversion element 7 can be made of, for instance, iNbO3 or LiTaO3. When the optical waveguide of the first wavelength-conversion element 4 is made of Nd:YVO4, an example of the light source element 1 can be an element that generates near-infrared laser light rays having a wavelength band of 800 nm.

More specifically, let a laser light source that generates a fundamental-wave laser light ray having a wavelength of 808 nm be the light source element 1. In this case, a laser light ray emitted from the first wavelength-conversion element 4 has a wavelength of 1064 nm. The laser light ray with a wavelength of 1064 nm, emitted from the first wavelength-conversion element 4 enters the second wavelength-conversion element 7. Consequently, the second wavelength-conversion element 7 emits a laser light ray with a wavelength of 532 nm. In other words, a light-source device is provided that emits laser light rays of G.

Light-source devices that emit primary colors other than G include fewer elements of various kinds. Hence, placing the collimating lens 12 outside the cap 11 is effective in a structure in which a plurality of light source elements are inside the cap 11, like the G laser.

The light-source device 101 is configured such that the light source section 20 includes the light source element 1 and the wavelength-conversion elements 4 and 7. Such a configuration would enable the light-source device 101 to be small in a high-profile structure like the G laser.

Figure 4:
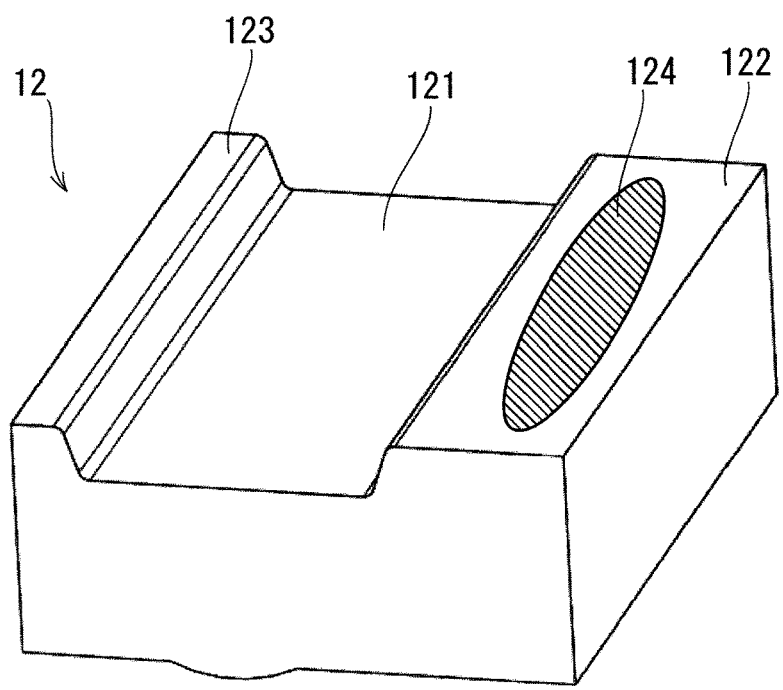
FIG. 4 is a perspective view of a collimating lens according to the first embodiment.

The following details the shape of the collimating lens 12. FIG. 4 is a perspective view of the collimating lens 12, viewed from its outgoing surface. The collimating lens 12 has a laser light path 121 that is the outgoing surface, and a first protrusion 122 and second protrusion 123 protruding in the same direction with the laser light path 121 interposed therebetween. The first protrusion 122 and the second protrusion 123 individually have surfaces on the same plane. The first protrusion 122 is bonded, at its surface, to the lens holder 15, and the second protrusion 123 is, at its surface, in contact with the lens holder 15.

In FIG. 4, an obliquely-hatched area indicates an application position 124 for an adhesive. The adhesive is applied to only the surface of the first protrusion 122 when the collimating lens 12 is bonded to the lens holder 15. The adhesive, when applied to the application position 124, is kept away from the laser light path 121. This reduces burns and outgassing due to the leakage of laser light rays in the adhesive.

The second protrusion 123 is merely in contact with the lens holder 15, and is not bonded to the lens holder 15. This would prevent the collimating lens 12 and the adhesive from, for instance, being detached from the lens holder 15 or breakage if the collimating lens 12 itself expands due to heat generation in the light source section 20. This also reduces a shift in position of the collimating lens 12.

The second protrusion 123 has a size corresponding to that of the first protrusion 122 (the height of the second protrusion 123, protruding from the laser light path 121 is the same as the height of the first protrusion 122). The second protrusion 123 serves as a spacer when the collimating lens 12 is bonded to the lens holder 15. This enables the distance between the collimating lens 12 and the lens holder 15 to be kept balanced. As such, for the first protrusion 122 to allocate the bonding surface and for the second protrusion 123 to serve as the spacer, a flat surface of the first protrusion 122 is desirably designed to have an area larger than an area of a flat surface of the second protrusion 123, with respect to the individual flat surfaces of the first protrusion 122 and second protrusion 123 on the same plane.

Figure 5:
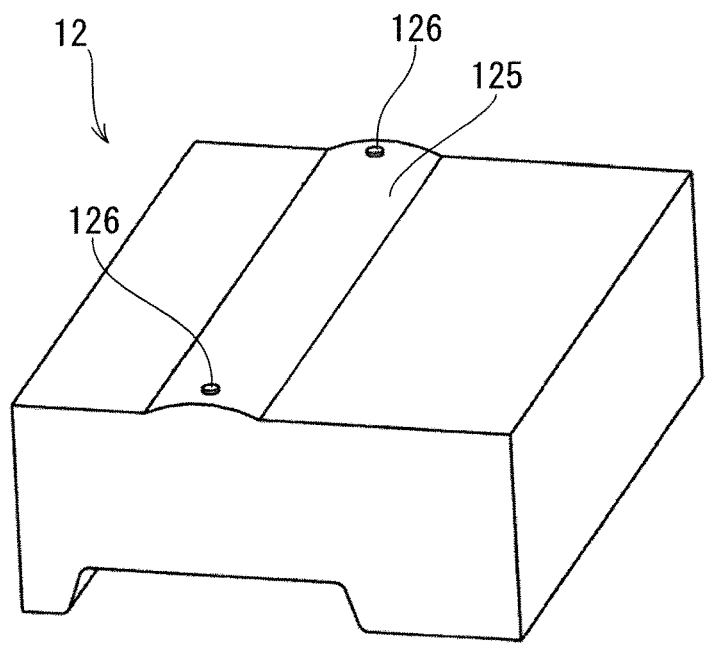
FIG. 5 is a perspective view of the collimating lens according to the first embodiment.

FIG. 5 is a perspective view of the collimating lens 12, viewed from its incident surface 125. In the collimating lens 12, the incident surface 125 has a convex shape of a lens surface. The light rays emitted from the light source section 20 enter the incident surface 125 and then exit from the laser light path 121. In this way, the light rays emitted from the light source section 20 are collimated (made parallel). The laser light ray emitted from the second wavelength-conversion element 7 included in the light source section 20 has an angle of divergence of 50 to 100 mrad. At this angle, the laser light ray is technically hard to enter, for instance, a display element for a projector device. However, the use of the collimating lens 12 enables the laser light ray to have a divergence angle of 20 to 30 mrad. Let the ratio of the angle of divergence of the light ray entering the collimating lens 12 to the angle of divergence of the light ray exiting from the collimating lens 12 be an angular magnification. In this case, the collimating lens 12 desirably has an angular magnification of 0.3 to 0.4 times.

The incident surface 125 has positioning portions 126 at both ends, which are the periphery of the collimating lens 12. The positioning portions 126 are used as markings for positioning when the lens holder 15 is bonded to the cap 11 after the collimating lens 12 is placed in the lens holder 15. In other words, the positioning portions 126 are used for the positioning of the collimating lens 12 with respect to the light source section 20. Specifically, the position of the lens holder 15 is adjusted in such a manner that the second wavelength-conversion element 7 is positioned between the two positioning portions 126 when viewed from the positive direction of the Z-axis.

Figure 6:
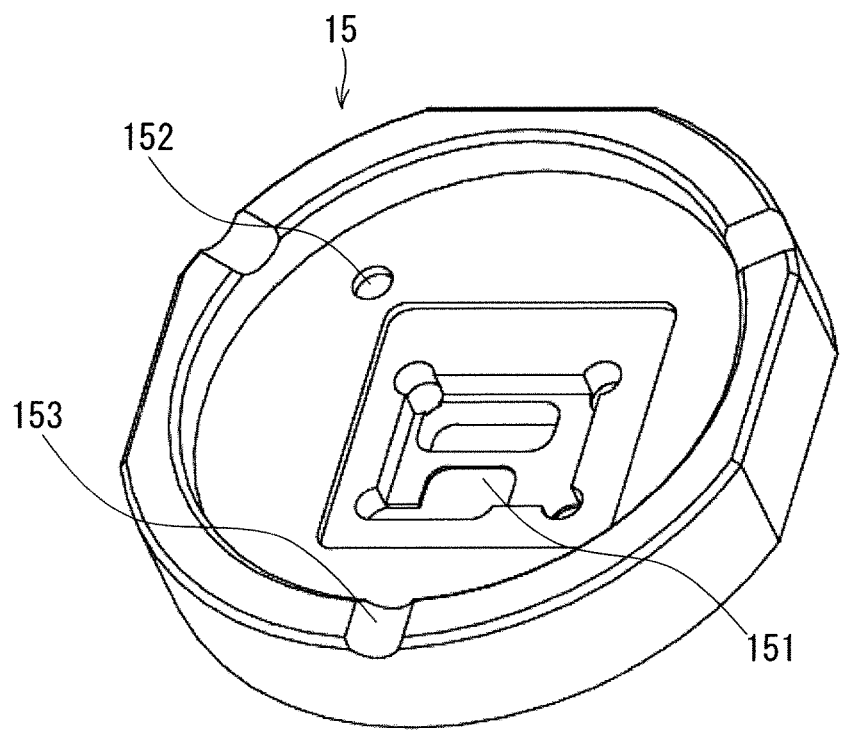
FIG. 6 is a perspective view of a lens holder according to the first embodiment.

FIG. 6 is a perspective view of a surface of the lens holder 15, bonded to the collimating lens 12. FIG. 7 is a perspective view of the lens holder 15 with the collimating lens 12 bonded thereto. As illustrated in FIGS. 6 and 7, the lens holder 15 has a hole 152 (positioning portion) for positioning with respect to the collimating lens 12. The hole 152 is used as a marking for positioning when the collimating lens 12 is bonded to the lens holder 15.

The surface of the lens holder 15, bonded to the first protrusion 122 of the collimating lens 12 has a cutout 151 so as to reflect the thickness of the adhesive. This enables the collimating lens 12 to be more firmly bonded to the lens holder 15.

The lens holder 15 has, at its outer periphery, three cutouts 153 to which an adhesive for adhesively fixing the lens holder 15 to the cap 11 is applied. For the adhesive applied to the cutouts 153, an ultraviolet-curing epoxy adhesive (ultraviolet-curing adhesive) is desirably used that has higher heat-resistance and smaller volume shrinkage during ultraviolet curing than an acrylic adhesive, which is typically used.

B. Second Embodiment

FIG. 8 is a schematically-illustrated cross-sectional view of a light-source device 102 according to a second embodiment. This cross-sectional view in FIG. 8 corresponds to the cross-sectional view of the light-source device 101 illustrated in FIG. 2. For simplification, FIG. 8 does not illustrate part of the cap 11 and the pin 14, which are illustrated in FIG. 2. The light-source device 102 includes a light source section 30 in place of the light source section 20 of the light-source device 101, and a collimating lens 32 in place of the collimating lens 12 of the light-source device 101. The light source section 30 includes a light source element 31, a first wavelength-conversion element 34, and a second wavelength-conversion element 37, where these elements are replaced for the respective light source element 1, first wavelength-conversion element 4, and second wavelength-conversion element 7 in the light source section 20 of the light-source device 101. The other components, which are the same as those in the first embodiment, are not described herein.

As illustrated in FIG. 8, the light source section 30 of the light-source device 102 according to the second embodiment is a multi-emitter light source section that emits a plurality of laser light rays LB2. The second wavelength-conversion element 37 emits a plurality of light rays. That is, the light source section 32 according to the second embodiment has a plurality of light-exit portions 38 corresponding to positions in the second wavelength-conversion element 37, in which the plurality of light rays are emitted. The plurality of light-exit portions 38 are each disposed in an X-direction in FIG. 8. Although FIG. 8 illustrates an example in which four light-exit portions 38 are arranged, the number of light-exit portions 38 is not limited to this value. The number of light-exit portions 38 is required to be adjusted in accordance with characteristics of the light source section 30. In addition, the light source section 30, when not including the wavelength-conversion elements 34 and 37, has the light-exit portions 38 in positions corresponding to positions in which the light source element 31 emits the plurality of light rays.

Figure 9:
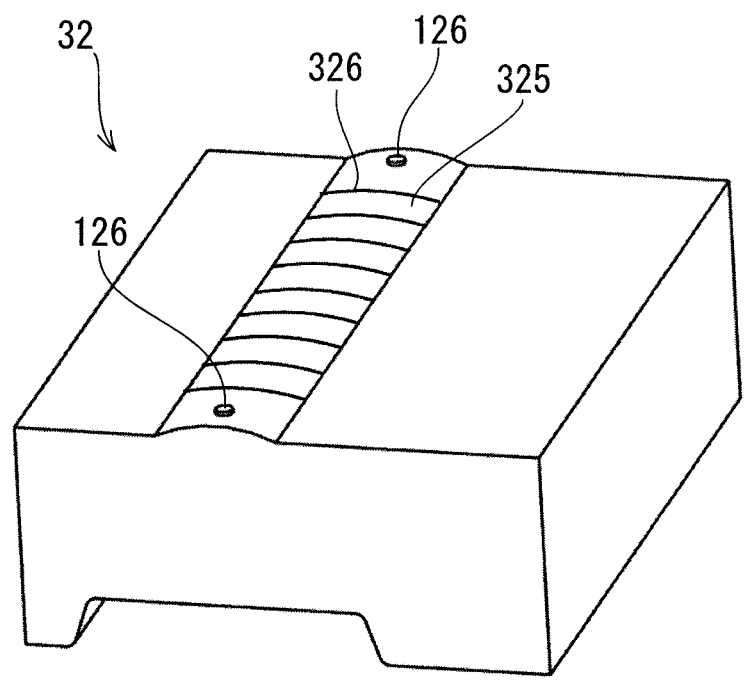
FIG. 9 is a perspective view of a collimating lens according to the second embodiment.

FIG. 9 is a perspective view of the collimating lens 32 according to the second embodiment. The perspective view illustrated in FIG. 9 corresponds to the perspective view illustrated in FIG. 5 in the first embodiment. As illustrated in FIG. 9, the collimating lens 32 according to the second embodiment has an incident surface that constitutes a micro lens array 326 that includes a plurality of micro lenses 325. Each micro lens 325 desirably has the angular magnification described in the first embodiment. The other components, which are the same as those in the first embodiment, are not described herein.

The plurality of micro lenses 325 are arranged in a longitudinal direction of a light-exit surface of the collimating lens 32, as many as the plurality of light-exit portions 38 of the light source section 30 illustrated in FIG. 8 in such a manner that the plurality of micro lenses 325 correspond one-to-one to the plurality of light-exit portions 38. The number of micro lenses 325 is adjustable in accordance with the number of light-exit portions 38 of the light source section 30.

The light-source device 102 according to the second embodiment is configured such that the light source section 30 has the plurality of light-exit portions 38, and that the collimating lens 32 includes the micro lens array 326 in which the plurality of micro lenses 325 corresponding one-to-one to the plurality of light-exit portions 38 are disposed. Such a configuration enables the light rays emitted from the light source section 30 to be efficiently collimated in the light source section 30, which is the multi-emitter light source section.

It is to be noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

DESCRIPTION OF REFERENCE NUMERALS 1, 31 light source element, 2 first submount, 3 first block, 4, 34 first wavelength-conversion element, 5 second submount, 6 second block, 7, 37 second wavelength-conversion element, 8 third submount, 9 third block, 10 transmission portion, 11 cap, 12 collimating lens, 13 stem, 14 pin, 15 lens holder, 16 opening, 20, 30 laser light source section, 21 laser light source unit, 22 lens unit, 31 light source element, 32 collimating lens, 34 first wavelength-conversion element, 37 second wavelength-conversion element, 38 light-exit portion, 100, 101, 102 light-source device, 121 laser light path (outgoing surface), 122 first protrusion, 123 second protrusion, 125 incident surface, 126 positioning portion, 151, 153 cutout, 152 hole, LB1, LB2 laser light ray.

The invention claimed is:
1. A light-source device comprising:
a laser light source section;
a stem on which said laser light source section is mounted;
a cap with an opening, said cap being joined to said stem in such a manner that said cap covers said laser light source section;

a lens holder joined to an outer surface of said cap in such a manner that said lens holder extends over said opening; and a collimating lens supported by said lens holder, said collimating lens collimating a light ray, the light ray being emitted from said laser light source section and passing through said opening, said collimating lens comprising:

an incident surface receiving said light ray from said laser light source section, an outgoing surface from which said light ray received by said incident surface exits, a first protrusion protruding from said outgoing surface and bonded to said lens holder, and a second protrusion protruding in the same direction as said first protrusion, from a position opposite to said first protrusion with respect to said outgoing surface, said second protrusion having a surface on the same plane as that of said first protrusion with a laser light path interposed between said first protrusion and said second protrusion and said second protrusion in contact with said lens holder without being bonded to said lens holder.

2. The light-source device according to claim 1, wherein said second protrusion is not bonded to said lens holder.

3. The light-source device according to claim 1, wherein said collimating lens comprises, at said incident surface, a positioning portion with respect to said laser light source section.

4. The light-source device according to claim 1, wherein said lens holder comprises a positioning portion with respect to said collimating lens.

5. The light-source device according to claim 1, wherein said lens holder is provided with a cutout at a surface of said lens holder, bonded to said first protrusion of said collimating lens.

6. The light-source device according to claim 1, wherein said laser light source section comprises a light source element, and a wavelength-conversion element.

7. The light-source device according to claim 1, wherein said laser light source section includes a plurality of light-exit portions, and wherein said collimating lens includes a micro lens array in which a plurality of micro lenses are disposed in positions corresponding one-to-one to said plurality of light-exit portions.

8. The light-source device according to claim 1, wherein said collimating lens changes an angle of divergence of said light ray emitted from said laser light source section to be 0.3 to 0.4 times said angle of divergence.

9. The light-source device according to claim 1, wherein said lens holder is fixed to said cap with an ultraviolet-curing adhesive.

* * * * *